(12) United States Patent
Inoue et al.

(10) Patent No.: US 7,037,817 B2
(45) Date of Patent: May 2, 2006

(54) SEMICONDUCTOR DEVICE AND METHOD FOR FABRICATING THE SAME

(75) Inventors: Kaoru Inoue, Shiga (JP); Yoshito Ikeda, Osaka (JP); Yutaka Hirose, Kyoto (JP); Katsunori Nishii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 121 days.

(21) Appl. No.: 10/889,028

(22) Filed: Jul. 13, 2004

(65) Prior Publication Data

US 2004/0238860 A1 Dec. 2, 2004

Related U.S. Application Data

(62) Division of application No. 10/372,979, filed on Feb. 26, 2003, now Pat. No. 6,770,922.

(30) Foreign Application Priority Data

Feb. 28, 2002 (JP) .............................. 2002-052723

(51) Int. Cl.
*H01L 21/4763* (2006.01)
(52) U.S. Cl. ...................... 438/590; 257/201; 257/615
(58) Field of Classification Search ................ 438/590
See application file for complete search history.

(56) References Cited

U.S. PATENT DOCUMENTS

| | | | |
|---|---|---|---|
| 5,830,776 A * | 11/1998 | Kurogane et al. | ............ 438/30 |
| 6,580,101 B1 | 6/2003 | Yoshida | |
| 6,593,193 B1 * | 7/2003 | Nishii et al. | ................ 438/285 |
| 2003/0020092 A1 | 1/2003 | Parikh et al. | |
| 2003/0186488 A1* | 10/2003 | Wen et al. | ................. 438/149 |

OTHER PUBLICATIONS

Masato et al."Novel High Drain Breakdown Voltage AlGaN/GaN HFETs Using Selective Thermal Oxidation Process." International Electron Devices Meeting, pp. 377-380, Dec. 10, 2000.
Inoue et al. "Novel Ga-N based MOS HFETs with Thermally Oxidized Gate Insulator." International Electron Devices Meeting, pp. 577-580, Dec. 2, 2001.

* cited by examiner

*Primary Examiner*—George Eckert
*Assistant Examiner*—Mursalin Bin Hafiz
(74) *Attorney, Agent, or Firm*—McDermott Will & Emery LLP

(57) ABSTRACT

A semiconductor device has a first semiconductor layer composed of a group III–V nitride, an oxide film formed by oxidizing a second semiconductor layer composed of a group III–V nitride to be located on the gate electrode formation region of the first semiconductor layer, an insulating film formed on the oxide film to have a composition different from the composition of the oxide film, and a gate electrode formed on the insulating film.

9 Claims, 4 Drawing Sheets

SEMICONDUCTOR DEVICE AND METHOD FOR FABRICATING THE SAME

This application is a divisional of application Ser. No. 10/372,979 filed Feb. 26, 2003 now U.S. Pat. No. 6,770,922.

BACKGROUND OF THE INVENTION

The present invention relates to a semiconductor device composed of a group III–V nitride semiconductor represented by a general formula $(In_xAl_{1-x})_yGa_{1-y}N$ (where $0 \leq X \leq 1$ and $0 \leq Y1$ are satisfied) and to a method for fabricating the same.

A group III–V nitride semiconductor such as GaN, AlGaN, InGaN, or InAlGaN, i.e., a so-called gallium nitride-based semiconductor is an important semiconductor for an optical device having a short oscillating wavelength such as a semiconductor laser device outputting, e.g., a blue laser beam. The applications of the gallium nitride-based semiconductor are not limited to the optical device. In recent years, attention has been focused on the gallium nitride-based semiconductor for its high dielectric breakdown field strength, high thermal conductivity, and high electron saturation velocity so that gallium nitride-based semiconductor is considered to be promising also as the material of an RF power device.

In an AlGaN/GaN heterojunction structure composed of aluminum gallium nitride (AlGaN) and gallium nitride (GaN) which are stacked in layers, in particular, electrons are accumulated at a high density in the vicinity of the heterojunction interface between AlGaN and GaN to form a so-called two-dimensional electron gas. The two-dimensional electron gas exhibits a high mobility since it exists spatially separated from a donor impurity used to dope AlGaN. Therefore, the AlGaN/GaN heterojunction structure achieves the effect of reducing a source resistance component when used in a field effect transistor (FET).

Since the distance d from a gate electrode to the two-dimensional gas is normally as small as several tens of nanometers, a ratio Lg/d between a gate length Lg and the distance d, which is termed an aspect ratio, can be held at a large value of 5 to 10 even if the gate length Lg is as small as about 100 nm. Hence, the use of the AlGaN/GaN heterojunction structure offers an advantage of easy fabrication of a FET with a reduced short channel effect and an excellent saturation characteristic.

The electron velocity of a two-dimensional electron in a high-field region of about $1 \times 10^5$ V/cm in the AlGaN/GaN-based heterojunction structure is double or more the electron velocity thereof in a gallium arsenide-based (GaAs-based) FET which is currently prevalent as an RF transistor, i.e., an AlGaAs/InGaAs heterostructure FET. In addition, the density of electrons accumulated at the heterointerface becomes as high as $1 \times 10^{13}/cm^2$ when the composition of Al in AlGaN is 0.2 to 0.3, which is about three to five times as high as the density of electrons in the GaAs-based device.

Since the dielectric breakdown field strength of the GaN-based heterostructure FET is about ten times as high as that of the GaAs-based FET, the application of a drain voltage therein which is ideally about ten times a drain voltage applied in the GaAs-based FET becomes possible on the assumption that the GaN-based heterostructure FET and the GaAs-based FET have the same device patterns. This renders the GaN-based heterostructure FET promising as an RF power device capable of generating an output power which is at least 5 times, ideally about 10 times as high as or higher than an output power generated by the GaAs-based power device but it also has numerous problems to be solved.

One of the problems associated with the GaN-based heterostructure FET is a large surface leakage current between the gate and drain thereof. A gate electrode composing a GaN-based heterostructure FET is a so-called Schottky gate electrode normally composed of a metal material with a relatively large work function coated directly on a semiconductor. As a metal material composing the Schottky gate electrode, a material having a large work function such as nickel (Ni), palladium (Pd), or platinum (Pt) is used appropriately.

If a current-voltage characteristic between the gate and drain is examined after the metal material is vapor-deposited, an abnormally large leakage current is observed frequently at a reverse voltage and a leakage current value cannot be reduced consistently. The large leakage current significantly increases an idle current component to the power device when a high negative voltage is applied to the gate electrode. As a result, the advantage of the GaN-based heterostructure FET that it can be driven at a high drain voltage cannot be used effectively any more, which presents a critical problem.

The occurrence of such a large gate leakage current may be attributed to a reaction between an oxide film (natural oxide film) formed on a surface of the GaN-based semiconductor and the metal material coated thereon and to a reaction between the surface of the GaN-based semiconductor and the metal material.

To prevent such reactions and thereby reduce the gate leakage current, there has been proposed a so-called MIS (Metal-Insulator-Semiconductor) structure or a MOS (Metal-Oxide-Semiconductor) structure in which an insulating film composed of a silicon nitride (SiN), a silicon dioxide ($SiO_2$), or the like is deposited on the surface of the GaN-based semiconductor and a gate electrode is formed on the deposited insulating film.

However, since the oxide film mentioned above exists at the interface between the gate insulating film and the GaN-based semiconductor or a trap is easily introduced into a surface of the semiconductor by a surface treatment performed in the fabrication process, a GaN-based FET using the MIS structure or MOS structure described above is not necessarily stable because of the current-voltage characteristic thereof which varies depending on the operating frequency.

SUMMARY OF THE INVENTION

As a result of making various examinations, the present inventors have found that a FET having a MOS structure obtained by directly thermally oxidizing a GaN-based semiconductor to form a thermal oxide film on the surface of the semiconductor, not by depositing an insulating film on the GaN-based semiconductor, and forming a gate electrode on the formed thermal oxide film has a relatively stable operating characteristic. This indicates that the number of traps formed in the interface between the thermal oxide film and the GaN-based semiconductor is relatively small so that such a MOS structure is promising in terms of stabilizing the operation of the FET and reducing a gate leakage current.

The present inventors have also found that, if the thickness of the thermal oxide film is relatively small in the MOS structure, the effect of reducing the gate leakage current is not sufficient and therefore the thickness of the thermal oxide film should be increased to a certain extent. The presumed reasons for this are as follows: Since a thermal oxide film formed by oxidizing a semiconductor composed of AlGaN is composed of gallium oxide ($Ga_2O_3$) and aluminum oxide ($Al_2O_3$) and contains, as a main component, gallium oxide having a relatively small energy gap of about 4.2 eV, the energy barrier thereof against electrons is not sufficiently high compared with the energy barrier of silicon dioxide having a large energy gap of 10 eV. In addition, the thermal oxide film composed of polycrystals of gallium oxide, aluminum oxide, and the like contains numerous grain boundaries in the polycrystals so that a leakage current flows through the grain boundaries.

Increasing the thickness of the gate oxide film to reduce the leakage current flowing through the grain boundaries reduces the transconductance of the FET disadvantageously so that the problem of a reduction in the performance of the FET occurs.

On the other hand, it has been reported that oxygen vacancies are formed readily at a high temperature in a MOS structure using a thermal oxide film formed by oxidizing a GaN-based semiconductor. Since the vacancies may function as an n-type impurity and change the conductivity of the thermal oxide film or the thermal oxide film may react with a metal material formed thereon, the long-term reliability cannot be obtained.

The present invention has been achieved in view of the foregoing conventional problems and it is therefore an object of the present invention to reduce a gate leakage current in a FET using a GaN-based semiconductor and improve the long-term reliability thereof.

To attain the object, a semiconductor device according to the present invention is composed of a GaN-based semiconductor and has a gate insulating film composed of an oxide film formed by oxidizing the GaN-based semiconductor and a discrete insulating film formed on the oxide layer.

Specifically, a semiconductor device according to the present invention comprises: a first semiconductor layer composed of a group III–V nitride; an oxide film formed by oxidizing a second semiconductor layer composed of a group III–V nitride to be located on a gate electrode formation region of the first semiconductor layer; an insulating film formed on the oxide film to have a composition different from a composition of the oxide film; and a gate electrode formed on the insulating film.

In the semiconductor device according to the present invention, the two-layer gate insulating film consisting of the oxide film formed by oxidizing the second semiconductor layer composed of the group III–V nitride and the insulating film formed on the oxide film to have a composition different from that of the oxide film is formed between the gate electrode and the first semiconductor layer composed of the group III–V nitride. Since the oxide film has been formed by oxidizing the semiconductor composed of the III–V nitride, the interface with the first semiconductor layer is in an excellent state with traps at a low density. This considerably reduces a gate leakage current and thereby significantly improves the output characteristic. In addition, the insulating film having a composition different from that of the oxide film and interposed between the oxide film and the gate electrode keeps the oxide film from direct contact with the gate electrode. This prevents a reaction between the respective materials composing the oxide film and the gate electrode and thereby improves the long-term reliability of the oxide film formed by oxidizing the semiconductor composed of the group III–V nitride.

In the semiconductor device according to the present invention, an energy gap of a material composing the insulating film is preferably larger than an energy gap of a gallium oxide.

In the semiconductor device according to the present invention, a thickness of the insulating film is preferably equal to or smaller than a thickness of the oxide film.

A first method for fabricating a semiconductor device according to the present invention comprises the steps of selectively thermally oxidizing a gate electrode formation region of a semiconductor layer composed of a group III–V nitride to form an oxide film formed by oxidizing at least an upper portion of the semiconductor layer; forming, on the oxide film, an insulating film having a composition different from a composition of the oxide film; and forming a gate electrode on the insulating film.

Since the first method for fabricating a semiconductor device forms the gate insulating film from the oxide film formed by oxidizing at least the upper portion of the semiconductor layer composed of the group III–V nitride and from the insulating film formed on the oxide film to have a composition different from that of the oxide film, the semiconductor device according to the present invention can be obtained reliably.

In the first method for fabricating a semiconductor device according to the present invention, the insulating film is preferably composed of a silicon oxide.

In the first method for fabricating a semiconductor device according to the present invention, a thickness of the insulating film is preferably equal to or smaller than a thickness of the oxide film.

A second method for fabricating a semiconductor device according to the present invention comprises the steps of: forming a semiconductor layer composed of a group III–V nitride; forming, on the semiconductor layer, a thin film having a composition different from a composition of the semiconductor layer; selectively thermally oxidizing a gate electrode formation region of each of the semiconductor layer and the thin film to form a first oxide film formed by oxidizing at least an upper portion of the semiconductor layer and a second oxide film formed by oxidizing the thin film; and forming a gate electrode on the second oxide film.

Since the second method for fabricating a semiconductor device forms the gate insulating film from the first oxide film formed by oxidizing at least the upper portion of the semiconductor layer composed of the group III–V nitride and from the second oxide film formed by oxidizing the thin film, the semiconductor device according to the present invention can be obtained reliably.

In the second method for fabricating a semiconductor device according to the present invention, the thin film is preferably composed of silicon.

In the second method for fabricating a semiconductor device according to the present invention, a thickness of the second oxide film is preferably equal to or smaller than a thickness of the first oxide film.

A third method for fabricating a semiconductor device according to the present invention comprises the steps of: forming a semiconductor layer composed of a group III–V nitride; forming an insulating film on the semiconductor layer; selectively thermally oxidizing a gate electrode formation region of the semiconductor layer to form an oxide film formed by oxidizing at least an upper portion of the semiconductor layer; and forming a gate electrode on the insulating film.

Since the third method for fabricating a semiconductor device forms the gate insulating film from the oxide film formed by oxidizing at least the upper portion of the semiconductor layer composed of the group III–V nitride and from the insulating film formed preliminarily on the oxide film, the semiconductor device according to the present invention can be obtained reliably.

In the third method for fabricating a semiconductor device according to the present invention, the insulating film is preferably composed of a silicon oxide.

In the third method for fabricating a semiconductor device according to the present invention, a thickness of the insulating film is preferably equal to or smaller than a thickness of the oxide film.

DETAILED DESCRIPTION OF THE INVENTION

Embodiment 1

A first embodiment of the present invention will be described with reference to the drawings.

Figure 1:
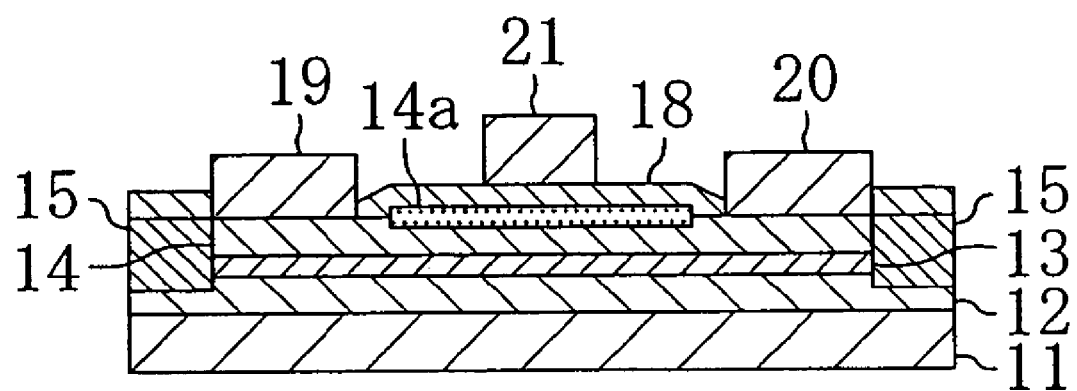
FIG. 1 is a structural cross-sectional view of a semiconductor device according to a first embodiment of the present invention.

FIG. 1 shows a cross-sectional structure of a semiconductor device according to the first embodiment, which is an insulated gate (MOS) FET having a gate insulating film consisting of a plurality of layers.

As shown in FIG. 1, a buffer layer 12 composed of gallium nitride (GaN) with a thickness of about 2 µm to 3 µm, a channel layer 13 composed of undoped gallium nitride with a thickness of about 10 nm to 100 nm, and a carrier supply layer 14 composed of aluminum gallium nitride (AlGaN) with a thickness of about 10 nm to 50 nm, e.g., are formed successively by epitaxial growth on a substrate 11 composed of sapphire (monocrystalline $Al_2O_3$) or silicon carbide (SiC).

The channel layer 13 may also be composed of undoped indium gallium nitride (InGaN) or have a multilayer structure consisting of undoped indium gallium nitride and undoped gallium nitride. Each of the gallium nitride or indium gallium nitride may also be doped with an n-type impurity at a concentration of about $1 \times 10^{17}/cm^3$ to $1 \times 10^{18}/cm^3$.

The composition of Al in the carrier supply layer 14 is about 25%. The carrier supply layer 14 has a three-layer structure consisting of an undoped first AlGaN layer with a thickness of about 3 nm, an n-type second AlGaN layer with a thickness of about 15 nm which is doped with silicon (Si) as an n-type impurity at a concentration of about $2 \times 10^{18}/cm^3$, and an undoped third AlGaN layer with a thickness of about 2 nm, which are stacked successively on the substrate 1. The composition of Al in the carrier supply layer 14 is preferably about 10% to 40% provided that the carrier supply layer 14 is partly doped with an n-type impurity.

The gate electrode 21 made of metal is composed of a thermal oxide film 14a formed by thermally oxidizing an upper portion of the carrier supply layer 14 to have a thickness of about 6 nm and an insulating film 18 made of silicon dioxide ($SiO_2$) formed on the thermal oxide film 14a to have a thickness of about 5 nm. Since the insulating film 18 is in direct contact with the gate electrode 21, a material having a value larger than the energy gap of gallium oxide ($Ga_2O_3$) composing the thermal oxide film 14a, such as silicon dioxide, is selected preferably to compose the insulating film 18 in terms of reducing a gate leakage current. Besides silicon dioxide, e.g., silicon nitride, aluminum oxide, or the like which is used frequently in a semiconductor fabrication process is used preferably. In the case of using silicon nitride, however, the level of a gate leakage current increases slightly compared with the case where silicon dioxide is used. It is also preferable to use an insulating material having a dielectric constant as high as possible.

Ohmic electrodes 19 and 20 are formed on an upper surface of the carrier supply layer 14 to be located on both sides of the gate electrode 21. An isolation region 15 surrounding an active region and reaching the buffer layer 12 is formed in a region outside the ohmic electrodes 19 and 20.

Thus, in the gate insulating film interposed between the carrier supply layer 14 and the gate electrode 21, the thermal oxide film 14a formed by oxidizing the carrier supply layer 14 has an interface with the carrier supply layer 14 and the insulating film 18 larger in energy gap than the thermal oxide film 14a has an interface with the gate electrode 21. Consequently, the thermal oxide film 14a formed by oxidizing the carrier supply layer 14 is kept from direct contact with the gate electrode 21 so that a gate leakage current flowing through grain boundaries contained in the thermal oxide film 14a is prevented. In addition, the insulating film 18 formed on the thermal oxide film 14a suppresses the formation of oxygen holes in the thermal oxide film 14a so that a gate leakage current is reduced significantly.

Since metal atoms composing the gate electrode 21 and atoms composing the thermal oxide film 14a are separated from each other by the insulating film 18 and do not react with each other, the long-term reliability of the gate insulating film is improved prominently.

A description will be given herein below to a method for fabricating the insulated gate FET thus constructed with reference to the drawings.

FIGS. 2A to 2E show the cross-sectional structures of the insulated gate FET according to the first embodiment in the individual process steps of the fabrication method therefor.

Figure 2A:
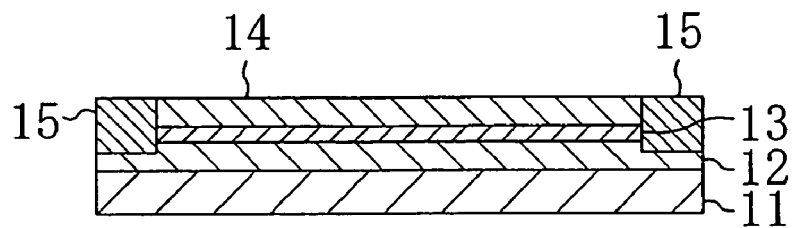
FIGS. 2A to 2E are structural cross-sectional views illustrating the individual process steps of a method for fabricating the semiconductor device according to the first embodiment.

First, as shown in FIG. 2A, the buffer layer 12 composed of gallium nitride with a thickness of about 2 µm to 3 µm, the channel layer 13 composed of undoped gallium nitride with a thickness of about 10 nm to 100 nm, and the carrier supply layer 14 composed of aluminum gallium nitride with a thickness of about 20 nm are grown successively on the substrate 11 composed of sapphire or silicon carbide by, e.g., metal organic vapor phase epitaxy (MOVPE). Then, the isolation region 15 for defining the active region of the transistor is formed selectively by thermal oxidation. A method for forming the isolation region 15 is not limited to thermal oxidation. The isolation region 15 may also be formed by ion implantation which implants carbon (C) ions or nitrogen (N) ions or by mesa isolation which removes the isolation region 15 by dry etching.

Figure 2B:
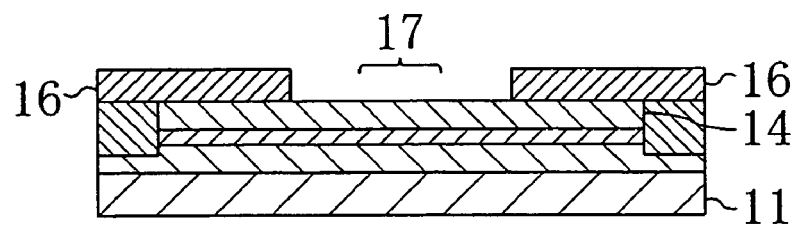

Next, as shown in FIG. 2B, a protective film 16 composed of silicon with a thickness of about 100 nm is formed by, e.g., CVD to cover the ohmic electrode formation regions of the carrier supply layer 14 and expose the gate electrode formation region 17 and its vicinity of the carrier supply layer 14.

Figure 2C:
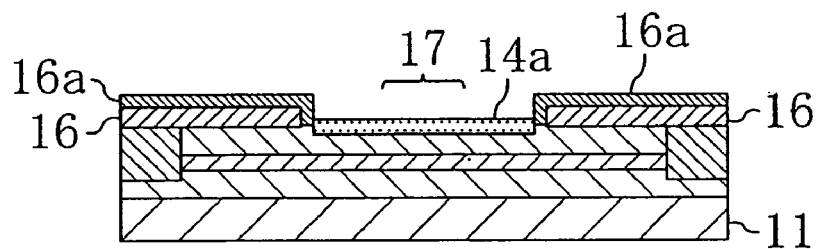

Next, as shown in FIG. 2C, a heat treatment is performed in a dry oxygen atmosphere at a temperature of about 900° C. for 20 minutes with respect to the carrier supply layer 14 by using the protective film 16 as a mask, thereby forming the thermal oxide film 14a formed by directly oxidizing the upper portion of the carrier supply layer 14 to have a thickness of about 6 nm in the gate electrode formation region 17 and its vicinity of the carrier supply layer 14. Although an oxide film 16a is also formed in the upper portion of the protective film 16 during the heat treatment, the protective film 16 is prevented from being entirely oxidized.

Figure 2D:
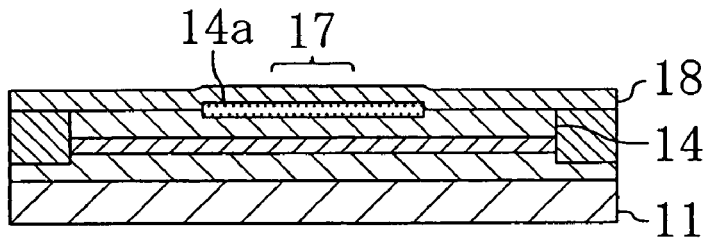

Next, as shown in FIG. 2D, the protective film 16 and the oxide film 16a are removed by using a solution mixture of hydrofluoric acid and nitric acid. At that time, the thermal oxide film 14a formed by oxidizing aluminum gallium nitride is hardly etched in the solution mixture of hydrofluoric acid and nitric acid. Then, the insulating film 18 composed of silicon dioxide with a thickness of about 5 nm is deposited by plasma CVD over the entire surface of the carrier supply layer 14 including the thermal oxide film 14a.

Figure 2E:
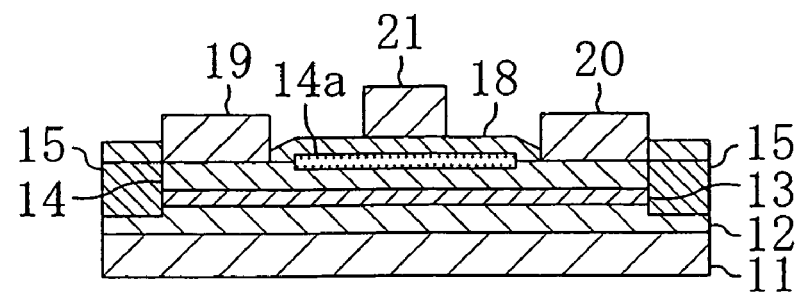

Next, as shown in FIG. 2E, the portion of the insulating film 18 corresponding to the ohmic electrode formation region is removed selectively. Subsequently, a resist pattern (not shown) having an opening corresponding to the ohmic electrode formation region is formed by lithography on the insulating film 18. Thereafter, an electrode forming film composed of titanium (Ti) with a thickness of about 20 nm and aluminum (Al) with a thickness of about 100 nm is formed successively by vacuum deposition. Then, the ohmic electrodes (a source electrode 19 and a drain electrode 20) are formed from the electrode forming film by a so-called lift-off process which removes the resist pattern. Subsequently, a heat treatment is performed in a hydrogen atmosphere at a temperature of about 550° C. for 1 minute and then the gate electrode 21 composed of Al and having a gate length of about 1.5 µm is formed by a lift-off process on the gate electrode formation region 17 of the insulating film 18.

The insulated gate FET according to the first embodiment thus obtained to have a gate length of about 1.5 µm exhibits a maximum drain current of 500 mA/mm and a maximum transconductance of 90 mS/mm.

Figure 3:
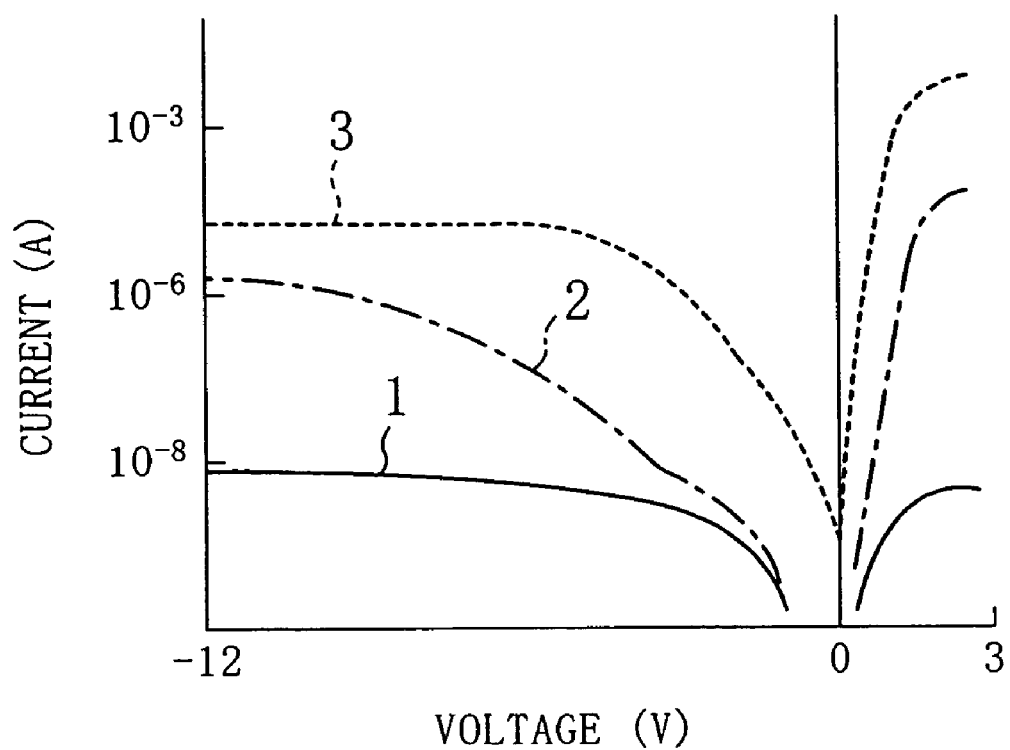
FIG. 3 is a graph showing a current-voltage characteristic between the gate and drain of the semiconductor device according to the first embodiment.

FIG. 3 shows a current-voltage characteristic between the gate and drain of the insulated gate FET according to the first embodiment. In FIG. 3, the curve 1 indicates the FET according to the first embodiment, the curve 2 indicates a FET for comparison having a gate insulating film formed by thermally oxidizing the upper portion of the carrier supply layer 14 to have a thickness of about 12 nm, and the curve 3 indicates a FET having a Schottky gate electrode.

As shown in FIG. 3, the curve 1 indicating the FET according to the present invention shows current values represented by the ordinate axis which are generally smaller by two to three orders of magnitude than those shown by the curve 2 indicating the FET having the gate insulating film composed only of the oxide of a GaN-based semiconductor. The curve 1 also shows values smaller by four to five orders of magnitude than those shown by the curve 3 indicating the FET having the Schottky gate. This clearly shows the effect of reducing the gate leakage current exerted by the gate insulating film formed to have a multilayer structure consisting of the thermal oxide film 14a of the GaN-based semiconductor and the insulating film 18 composed of silicon dioxide.

A gate-to-drain breakdown voltage obtained when the gate-to-drain distance is 6 µm is as high as 300 V or more. The value indicates a 50% improvement compared with 200 V which is a breakdown voltage obtained when the gate insulating film is composed only of a thermal oxide film of a GaN-based semiconductor.

Embodiment 2

A second embodiment of the present invention will be described with reference to the drawings.

In contrast to the first embodiment which has formed the thermal oxide film 14a of the GaN-based semiconductor and the overlying insulating film 18, each composing the gate insulating film, in different steps, the second embodiment preliminarily forms a semiconductor thin film on a GaN-based semiconductor (carrier supply layer 14) and then changes the semiconductor thin film into an insulating film in a heat treatment step for forming the thermal oxide film 14a.

FIGS. 4A to 4E show the cross-sectional structures of the insulated gate FET according to the second embodiment in the individual process steps of a fabrication method therefor.

Figure 4A:
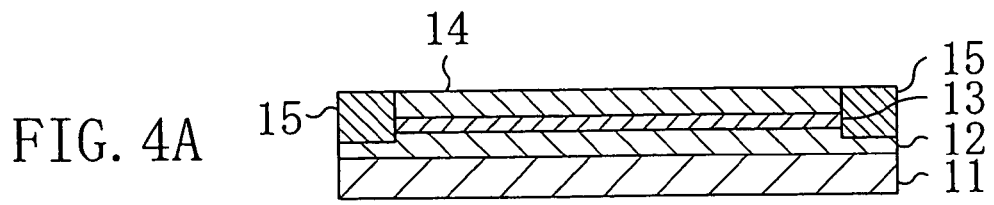
FIGS. 4A to 4E are structural cross-sectional views illustrating the individual process steps of a method for fabricating a semiconductor device according to a second embodiment of the present invention.

First, as shown in FIG. 4A, the buffer layer 12 composed of gallium nitride with a thickness of about 2 µm to 3 µm, the channel layer 13 composed of undoped gallium nitride with a thickness of about 10 nm to 100 nm, and the carrier supply layer 14 composed of aluminum gallium nitride with a thickness of about 20 nm are grown successively on the substrate 11 composed of sapphire or silicon carbide by, e.g., MOVPE. Then, the isolation region 15 for defining the active region of the transistor is formed selectively.

Figure 4B:
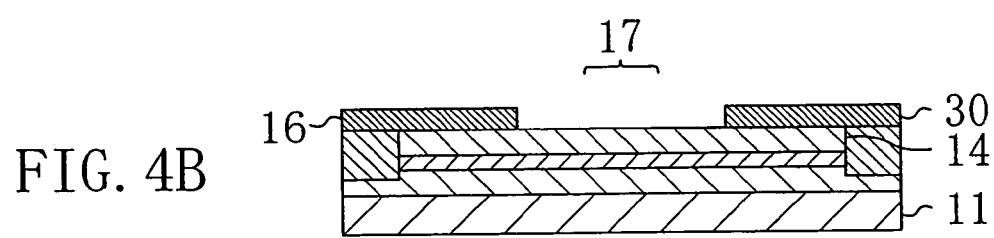

Next, as shown in FIG. 4B, a protective film 30 composed of silicon dioxide with a thickness of about 100 nm is formed by, e.g., plasma CVD to cover the ohmic electrode formation regions of the carrier supply layer 14 and expose the gate electrode formation region 17 and its vicinity of the carrier supply layer 14.

Figure 4C:
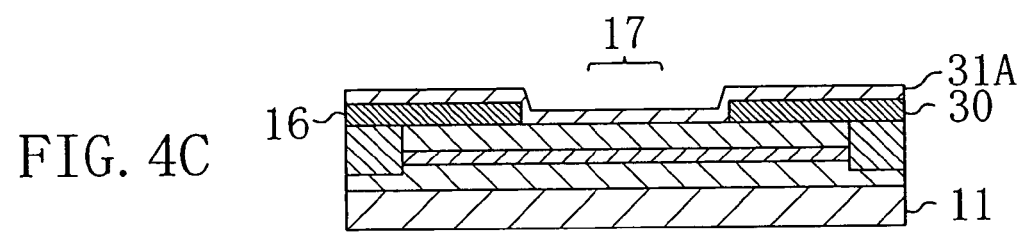

Next, as shown in FIG. 4C, a thin film 31A composed of silicon (Si) with a thickness of about 3 nm to 10 nm is deposited by, e.g., CVD over the entire surface of the carrier supply layer 14 including the protective film 30.

Figure 4D:
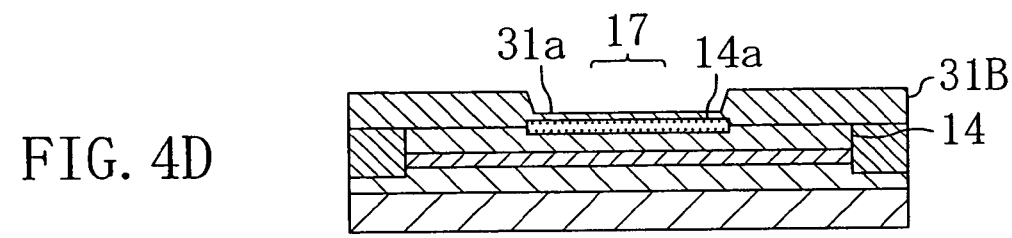

Next, as shown in FIG. 4D, a heat treatment is performed in a dry oxygen atmosphere at a temperature of about 900° C. for about 1 to 2 hours with respect to the thin film 31A and to the carrier supply layer 14, thereby forming the thermal oxide film 14a formed by directly oxidizing the upper portion of the carrier supply layer 14 to have a thickness of several nanometers in the gate electrode formation region 17 and its vicinity of the carrier supply layer 14. The thin film 31A oxidized by the heat treatment is integrated with the protective film 30 having the same composition as the thin film 31A to be changed into an oxide film 31B and the portion of the oxide film 31B including the gate electrode formation region 17 is changed into a thermal oxide thin film 31a.

Figure 4E:
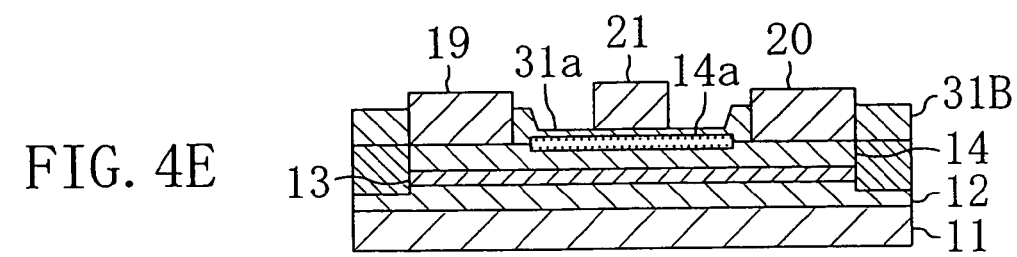

Next, as shown in FIG. 4E, the portions of the oxide film 31B corresponding to the ohmic electrode formation regions are selectively removed. Then, the ohmic electrodes (the source electrode 19 and the drain electrode 20) each composed of titanium with a thickness of about 20 nm and aluminum with a thickness of about 100 nm are formed by a lift-off process. Subsequently, a heat treatment is performed in a hydrogen atmosphere at a temperature of about 550° C. for 1 minute and then the gate electrode 21 composed of Al and having a gate length of about 1.5 μm is formed by a lift-off process on the gate electrode formation region 17 of the thermal oxide thin film 31a.

The insulated gate FET according to the second embodiment thus obtained to have a gate length of about 1.5 μm exhibits a maximum drain current of 550 mA/mm and a maximum transconductance of 100 mS/mm when the thickness of the thermal oxide thin film 31a is 3 nm and the heat treatment time is 1 hour.

The current-voltage characteristic between the gate and drain of the insulated gate FET according to the second embodiment is substantially equal to the characteristic indicated by the curve 1 shown in FIG. 3. Accordingly, the effect of reducing the gate leakage current achieved by the multilayer structure consisting of the thermal oxide film 14a and the thermal oxide thin film 31a was observed in the same manner as in the first embodiment.

A gate-to-drain breakdown voltage obtained when the gate-to-drain distance is 6 μm is as high as 300 V or more, which is the same as in the first embodiment.

In a variation of the second embodiment, silicon dioxide may also be used instead of silicon used to compose the thin film 31A in the step of depositing a thin film shown in FIG. 4C. In the case of using silicon dioxide for the thin film 31A, however, the thickness thereof is preferably 5 nm to 20 nm for the prevention of a significant reduction in the transconductance of the FET.

What is claimed is:

1. A method for fabricating a semiconductor device, the method comprising the steps of:
    forming a semiconductor layer composed of a group Ill–V nitride;
    forming, on the semiconductor layer, a thin film having a composition different from a composition of the semiconductor layer;
    selectively thermally oxidizing a gate electrode formation region of each of the semiconductor layer and the thin film to form a first oxide film formed by oxidizing at least an upper portion of the semiconductor layer and a second oxide film formed by oxidizing the thin film; and
    forming a gate electrode on the second oxide film.

2. The method of claim 1, wherein the thin film is composed of silicon.

3. The method of claim 1, wherein a thickness of the second oxide film is equal to or smaller than a thickness of the first oxide film.

4. A method for fabricating a semiconductor device, the method comprising the steps of:
    forming a semiconductor layer composed of a group III–V nitride;
    forming an insulating film on the semiconductor layer;
    selectively thermally oxidizing a gate electrode formation region of the semiconductor layer to form an oxide film formed by oxidizing at least an upper portion of the semiconductor layer; and
    forming a gate electrode on the insulating film.

5. The method of claim 4, wherein the insulating film is composed of a silicon oxide.

6. The method of claim 4, wherein a thickness of the insulating film is equal to or smaller than a thickness of the oxide film.

7. A method for fabricating a semiconductor device, the method comprising the steps of:
    selectively thermally oxidizing a gate electrode formation region of a semiconductor layer composed of a group III–V nitride to form an oxide film formed by oxidizing at least an upper portion of the semiconductor layer;
    forming, on the oxide film, an insulating film having a composition different from a composition of the oxide film; and
    forming a gate electrode on the insulating film.

8. The method of claim 7, wherein the insulating film is composed of a silicon oxide.

9. The method of claim 7, wherein
    a thickness of the insulating film is equal to or smaller than a thickness of the oxide film.

* * * * *